United States Patent [19]

Cunningham et al.

[11] Patent Number: 4,784,967

[45] Date of Patent: Nov. 15, 1988

[54] METHOD FOR FABRICATING A FIELD-EFFECT TRANSISTOR WITH A SELF-ALIGNED GATE

[75] Inventors: John E. Cunningham, Eatontown; Erdmann F. Schubert, Hazlet; Won-Tien Tsang, Holmdel, all of N.J.

[73] Assignee: American Telephone and Telegraph Company, AT&T Bell Laboratories, Murray Hill, N.J.

[21] Appl. No.: 944,457

[22] Filed: Dec. 19, 1986

[51] Int. Cl.⁴ .......................................... H01L 21/302
[52] U.S. Cl. ........................ 437/40; 437/176; 437/912; 437/944; 437/203; 437/126; 437/105; 437/153; 437/041; 437/DIG. 984; 148/DIG. 145; 148/142
[58] Field of Search .............. 357/56, 55, 20, 68, 357/15; 29/571, 578, 580; 148/DIG. 56, DIG. 51, DIG. 142, DIG. 145, 175, 1.5, 114, 188; 437/184, 39, 38, 126, 155, 105, 107, 944

[56] References Cited

U.S. PATENT DOCUMENTS

| | | | |
|---|---|---|---|
| 3,775,200 | 11/1973 | de Nobel et al. | 357/56 |
| 3,993,515 | 11/1976 | Reichert | 357/68 |
| 4,029,542 | 6/1977 | Swartz | 357/56 |
| 4,029,562 | 7/1977 | Feng et al. | 357/56 |
| 4,034,394 | 7/1977 | Kamo et al. | 357/56 |
| 4,197,551 | 4/1980 | Adlerstein | 357/56 |
| 4,317,125 | 2/1982 | Hughes et al. | 29/590 |
| 4,325,073 | 4/1982 | Hughes et al. | 29/590 |
| 4,325,181 | 4/1982 | Yoder | 29/591 |
| 4,647,339 | 3/1987 | Houghton | 357/56 |

OTHER PUBLICATIONS

"Ohmic Contacts to n-GaAs using graded band gap layers of $Ga_{1-x}In_x$ As grown by molecular beam epitaxy", J. M. Woodall, et al., J. Vac. Sci. Tech. 19(3) 1981, pp. 626–627.

"Delta-doped ohmic contacts to n-GaAs", E. F. Schubert et al, Appl. Phys. Lett. 49(5), Aug. 1986, pp. 292–294.

Primary Examiner—Brian E. Hearn
Assistant Examiner—Beverly Ann Pawlikowski
Attorney, Agent, or Firm—Daniel D. Dubosky; Gregory C. Ranieri

[57] ABSTRACT

A method of fabricating a field-effect transistor is disclosed wherein only two masking steps are used in the development of the device. The semiconductor wafer used in the process has a non-alloyed contact at its top surface, that is, a contact which does not require alloying temperatures in excess of 200 degrees C. The first mask is used to create conventional mesa structures which isolate each individual field-effect transistor from its adjacent neighbors. A second mask is utilized to define the source and drain electrodes and also to create a gap through which the gate electrode structure is fabricated. By using a single mask for creation of both the source and drain electrodes and the gate structure, very close tolerances are obtained between the gate structure and the source and drain regions.

3 Claims, 3 Drawing Sheets

METHOD FOR FABRICATING A FIELD-EFFECT TRANSISTOR WITH A SELF-ALIGNED GATE

This invention relates to a method for fabricating field-effect transistors and more particularly to a method for fabricating field-effect transistors having non-alloyed contacts.

BACKGROUND OF THE INVENTION

Conventional field-effect transistors are fabricated using a three mask process. A first mask is used to define an area on a semiconductor wafer for each field-effect transistor by etching a material outside of the photoresist covering developed by using the mask and conventional photolithography techniques. the mesa which is developed through this etching defines the active area of each device and insulates a field-effect transistor from its adjacent neighbors. A second mask is then utilized to define the ohmic contacts which become the source and drain electrodes. After etching the metallic layer so as to define these contacts, the photoresist material deposited through use of the second mask must be removed since the photoresist material cannot withstand the high temperatures used to alloy the contacts. These temperatures are usually greater than 200 degrees C. After alloying the contacts a third mask is then used in order to define an area between the source and drain electrodes which will accommodate the gate structure of the field-effect transistor. Since this third mask must be optically aligned with the source and drain electrodes, it is typical to allow a 1 to 2 $\mu m$ separation between the gate structure and the source and drain electrodes. A higher speed field-effect transistor could be realized if an even closer tolerance could be obtained between the gate structure and the source and drain electrodes.

SUMMARY OF THE INVENTION

A high-speed field-effect transistor having a self-aligned gate structure is obtained in accordance with the present invention wherein only two masks are used in the fabrication of the field-effect transistor. A first mask is used as in the prior art to define mesas which consist of individual electrically isolated mounds on a semiconductor wafer. The wafer used in the present process must be one where contact is provided to the current channel through a non-alloyed contact. A second mask is used to lay down photoresist material both for the development of the source and drain contacts and for development of the gate structure. The present invention is based on the realization that the photoresist material need not be removed after the development of the source and drain contacts. Instead a metallic material is deposited over the entire wafer and this material deposits through the gap in the photoresist material created by the second mask in order to develop a Schottky gate contact to the semiconductor material. As a result a completely self-aligned gate electrode is provided with extremely close tolerance between the gate structure and the source and drain regions of the field-effect transistor.

BRIEF DESCRIPTION OF THE DRAWING

The invention will be more readily understood after reading the following detailed description in combination with the drawings wherein.

DETAILED DESCRIPTION

Figure 1:
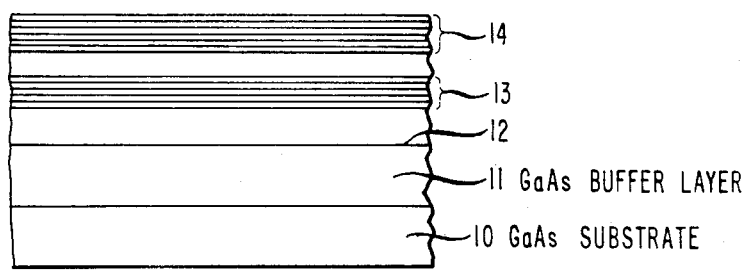
FIGS. 1 through 7 are cross-sectional diagrams of a semiconductor wafer on which field-effect transistors are fabricated using the present invention.
Figure 2:
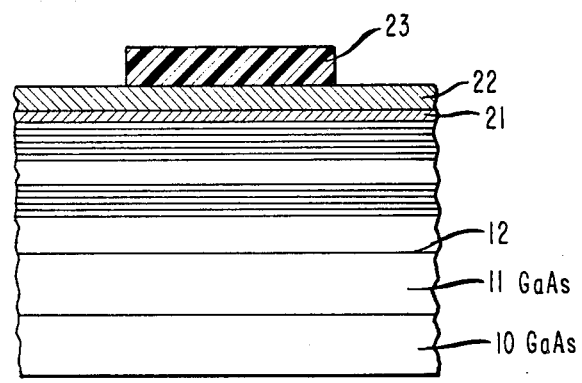

A cross-sectional diagram of a semiconductor wafer that can be used in the practice of the present invention is shown in FIG. 1. As shown in this figure, the epitaxially grown structure consists of a Gallium Arsenide (GaAs) substrate 10 followed by a GaAs buffer layer 11 which in turn is followed by an electron channel 12. In the wafer which was fabricated the electron channel 12 was a delta doped electron channel of the type described in the patent application entitled "Field-Effect Transistor Having a Delta-Doped Ohmic Contact", Ser. No. 871,249, filed June 6, 1986, by J. E. Cunningham, E. F. Schubert and W-T. Tsang. Channel 12 and the other layers shown in FIG. 1 were fabricated using a molecular beam epitaxial apparatus. The only essential element which the wafer must have in order to practice the present invention is a top non-alloyed contact layer 14. This top non-alloyed contact layer 14 can be achieved by any one of several prior art means. In the wafer fabricated, layer 14 was a delta doped non-alloyed ohmic contact of the type described in the article entitled "Delta doped Ohmic Contacts to N-GaAs", *Appl. Physics Letters*, Vol. 49, 1986, E. F. Schubert et al., pp. 292–294. Layer 14 may also be provided by a narrow gap semiconductor material, for example, InAs on top of a GaAs, as described in the article entitled "Ohmic contacts to n-GaAs using graded band gap layers of $Ga_{1-x}In_xAs$ grown by molecular beam epitaxy", *J. Vac. Sci. Technol.*, 19(3), Sept./Oct. 1981, J. M. Woodall et al., pp. 626–627.

Between the electronic channel 12 and the non-alloyed contact layer 14 an additional doped layer 13 may be fabricated in order to reduce the effect of a parasitic resistance. This layer 13 may also consist of a homogeneous doped semiconductor or of a series of delta doped layers as in the present embodiment. It should be understood by those skilled in the art, however, that layer 13 is not absolutely necessary in order to fabricate a field-effect transistor.

After a semiconductor wafer of the type shown in FIG. 1 has been grown, a metallic layer 21 is deposited on the top surface by evaporation immediately after crystal growth to inhibit the formation of an undesired oxide layer between the non-alloyed contact layer 14 and metallic layer 21. The metal used in layer 21 should adhere quite well to the non-alloyed contact layer 14. In the present embodiment titanium is used for layer 21. An additional metallic layer 22 of a noble metal is deposited on top of metallic layer 21 in order to decrease the ohmic resistance provided by the metallic layers. In the wafer that was fabricated, gold was used for metallic layer 22. This noble metal also inhibits the formation of oxides on the top of the titanium layer 21.

Figure 3:
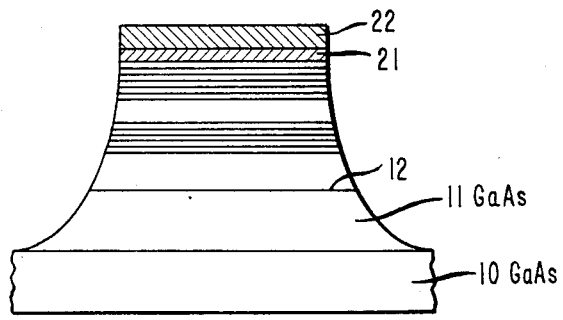

A first mask is then utilized through conventional photolithography to establish a photoresist layer 23 over the metallic layer 22. This photoresist layer 23 is used to define areas on the semiconductor wafer which will correspond to the active regions of the field-effect transistors. Conventional etchants are then used to remove the material of metallic layers 21 and 22 and the semiconductor materials that are not covered by photoresist layer 23. In this way conventional mesa structures are developed which insulate one device on the wafer from adjacent devices. After the photoresist material of layer 23 has been dissolved the mesa structure that remains for each field-effect transistor is shown in FIG. 3. The use of the first mask in the present invention is identical to the use of a first mask in the conventional fabrication of field-effect. transistors.

Figure 4:
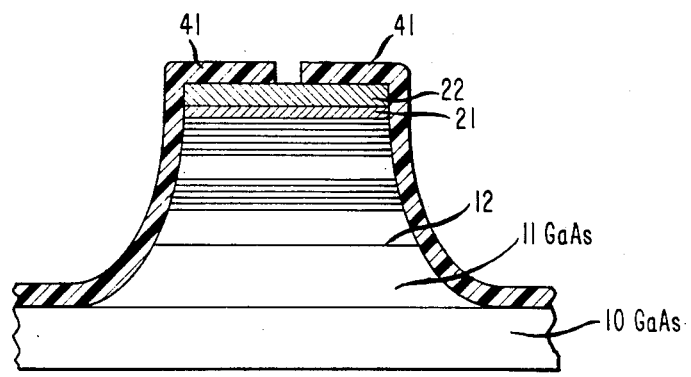
Figure 5:
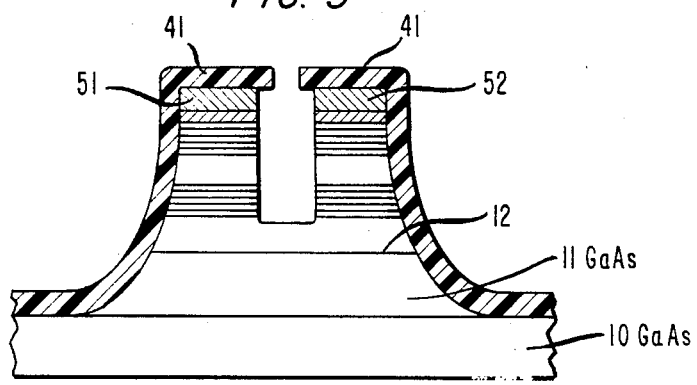
Figure 6:
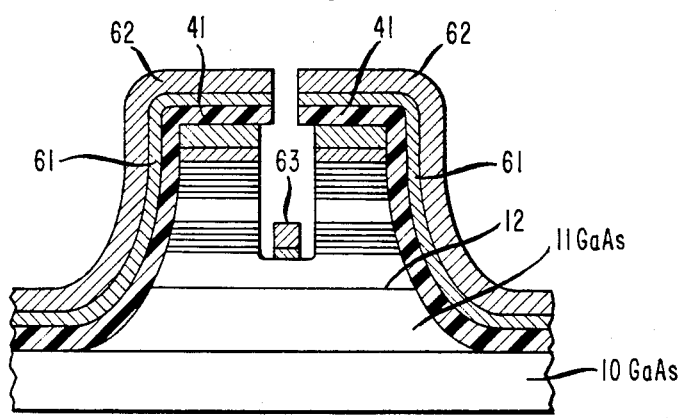

A second mask is then used through conventional photolithography techniques to establish a photoresist layer 41 over all of the wafer except for a gap over metallic layer 22, as shown in FIG. 4. This gap in the photoresist layer 41 is placed at a position which corresponds to the gap which will exist between the source and drain electrodes of the field-effect transistor. A conventional metallic etchant consisting of 13 grams of potassium iodide and 7 grams of iodine in 250 milliliters of water is then applied in order to etch metallic layers 22 and 21 that are present underneath the gap in photoresist layer 41. During this etching of the metallic layers a small undercut of about 0.05 to 0.2 µm of the metallic layer occurs. In this way metallic layers 21 and 22 are separated into electrode 51 and drain electrodes 52 for each of the field-effect transistors as shown in FIG. 5. The GaAs material underneath the gap in photoresist layer 41 is then etched away in order to create a gap in the non-alloyed contact layer 14 and in the parasitic resistance reduction layer 13 where such a layer is present. The gap created during this semiconductor etching process must be sufficient such that the only electrical connection between the source and drain electrodes is through the electron channel 12 and not through any upper layers used to provide an ohmic contact. A metallic layer 61 consisting of titanium is then deposited over the entire wafer to obtain a layer having a thickness of about 500 Å. This is followed by the deposit of a gold metallic layer 62 over the titanium layer 61 to obtain a layer of about 1500 Å. During this deposition, the metallic materials of titanium and gold also deposit through the gap of photoresist layer 41 thereby forming a Schottky gate electrode 63 over the semiconductor material as shown in FIG. 6.

Figure 7:
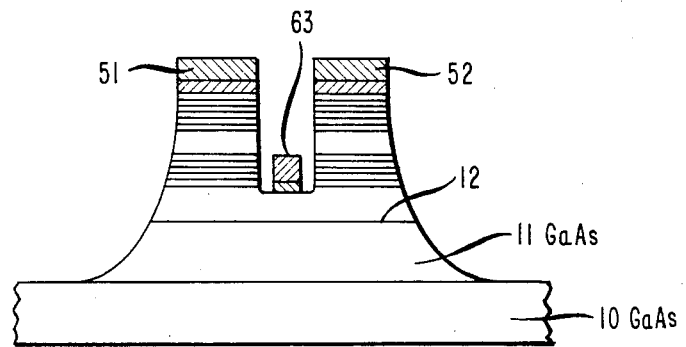

The photoresist material of layer 41 is then removed thereby removing all of the metallic layer 61 and 62 except that which has been deposited on the semiconductor material through the gap in photoresist layer 41. The resulting field-effect transistor is shown in FIG. 7. Since the gate electrode 63 has been deposited through the same gap in photoresist layer 41 that was used to create the source and drain electrodes, the lateral distance between the gate electrode and the source and drain regions is dependent only on the amount of undercutting which takes place during the above-described etchant steps. In the embodiment constructed this undercutting resulted in a lateral distance between the gate electrode and the source and drain regions of only 0.05 to 0.2 µm. This small gate electrode tolerance is achieved in the present invention since a single mask has been utilized to develop the source and drain electrodes and the gate structure. The gate is self-aligned and this self-alignment has the advantages of keeping tolerances small and therefore keeping parasitic resistances small.

Figure 8:
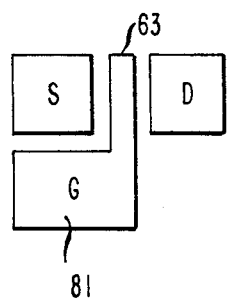
FIG. 8 is a top view of the electrode structure for each field-effect transistor.

FIG. 8 shows a top view of the self-aligned field-effect transistor. As shown in FIG. 8 the gate electrode 63 is joined to a much larger pad 81 in order to facilitate connection to the gate electrode.

What has been described hereinabove is an illustrative embodiment of the present invention. Numerous departures may be made by those skilled in the art without departing from the spirit and scope of the present invention. For example, a combination of three metals consisting, for example, of titanium, platinum and gold could also be used in order to develop the gate electrode. Similarly other semiconductor materials could also be used in fabrication of the field-effect transistors.

What is claimed is:

1. A method of fabricating field-effect transistors each having a source, drain and gate electrode comprising the steps of epitaxially growing layers on a semiconductor substrate including at least a current channel followed by a non-alloyed contact to form a semiconductor wafer, depositing a metallic layer over said non-alloyed contact, masking areas on the wafer corresponding to individual field-effect transistors using photoresist material and photolithography techniques, etching the metallic layer and the epitaxially grown layers to develop mesas corresponding to individual field-effect transistors, dissolving the deposited photoresist material used to define the mesa structures, masking the wafer using photolithograhy and photoresist material to define an area in each of the remaining metallic layers at the top of each mesa for the gate electrode structure of each field-effect transistors, etching in the defined areas to remove the exposed metallic layer and the non-alloyed contact, depositing a metallic layer over the entire wafer including the defined areas to form a gate structure in each defined area, and removing the photoresist material deposited during the second masking step.

2. A method as defined in claim 1 wherein the step of depositing a metallic layer over said non-alloyed contact comprises the step of depositing a first metal over the non-alloyed contact in order to inhibit the formation of an undesired oxide layer, and depositing a second metal layer consisting of a noble metal over said first metal.

3. A method as defined in claim 1 wherein the step of depositing a metallic layer so as to form a gate structure comprises the steps of depositing a first metal that adheres well to semiconductor material, and depositing a second metal that consists of a metal having a low ohmic resistance.

* * * * *